(12) United States Patent
Qin

(10) Patent No.: US 12,362,001 B2
(45) Date of Patent: Jul. 15, 2025

(54) VOLTAGE GENERATING CIRCUIT AND MEMORY

(71) Applicant: CHANGXIN MEMORY TECHNOLOGIES, INC., Hefei (CN)

(72) Inventor: Jianyong Qin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 174 days.

(21) Appl. No.: 18/364,481

(22) Filed: Aug. 3, 2023

(65) Prior Publication Data

US 2024/0071463 A1 Feb. 29, 2024

Related U.S. Application Data

(63) Continuation of application No. PCT/CN2022/132407, filed on Nov. 17, 2022.

(30) Foreign Application Priority Data

Aug. 26, 2022 (CN) .......................... 202211037861.8

(51) Int. Cl.
*G11C 11/4074* (2006.01)
*G05F 1/575* (2006.01)
*G05F 1/577* (2006.01)

(52) U.S. Cl.
CPC .......... *G11C 11/4074* (2013.01); *G05F 1/575* (2013.01); *G05F 1/577* (2013.01)

(58) Field of Classification Search
CPC ...... G11C 11/4074; G05F 1/575; G05F 1/577
See application file for complete search history.

(56) References Cited

U.S. PATENT DOCUMENTS 6,084,387 A * 7/2000 Kaneko ................. H02M 3/073
                                                    323/281
7,684,246 B2 * 3/2010 Jeong ....................... G11C 5/145
                                                    365/185.23

(Continued)

FOREIGN PATENT DOCUMENTS

| CN | 102385910 A | 3/2012 |
| CN | 109270978 A | 1/2019 |
| WO | 2022105890 A1 | 5/2022 |

OTHER PUBLICATIONS

International Search Report cited in PCT/CN2022/132407 mailed May 19, 2023, 7 pages.

*Primary Examiner* — Khamdan N. Alrobaie
(74) *Attorney, Agent, or Firm* — SYNCODA LLC; Feng Ma

(57) ABSTRACT

The present disclosure provides a voltage generating circuit and a memory. The voltage generating circuit includes: a voltage output module configured to receive a reference voltage, generate a first output voltage, and provide the first output voltage to a power supply node, where the power supply node is connected to a load to supply power to the load; a voltage stabilizing module configured to receive the reference voltage and generate and output a control signal; and a compensation module configured to receive a power voltage, a flag signal and the control signal, be turned on in response to the flag signal, and configured to provide a second output voltage to the power supply node in response to a voltage value of the control signal, such that a voltage of the power supply node is recovered to the first output voltage.

14 Claims, 5 Drawing Sheets

(56) References Cited

U.S. PATENT DOCUMENTS

| | | | | |
|---|---|---|---|---|
| 2007/0070695 A1* | 3/2007 | Lim | ................... | G11C 11/4074 |
| | | | | 365/185.09 |
| 2009/0243704 A1* | 10/2009 | Kang | ..................... | G11C 5/145 |
| | | | | 327/541 |
| 2017/0220058 A1* | 8/2017 | Petenyi | ................... | G05F 1/575 |
| 2020/0409402 A1* | 12/2020 | Chang | ....................... | G05F 1/59 |
| 2021/0202015 A1* | 7/2021 | Janjua | .................... | H10B 43/27 |
| 2024/0126313 A1* | 4/2024 | Ku | .......................... | G05F 1/575 |

\* cited by examiner

VOLTAGE GENERATING CIRCUIT AND MEMORY

CROSS-REFERENCE TO RELATED APPLICATIONS

This is a continuation of International Patent Application No. PCT/CN2022/132407, filed on Nov. 17, 2022, which claims the priority to Chinese Patent Application No. 202211037861.8, titled "VOLTAGE GENERATING CIRCUIT AND MEMORY" and filed on Aug. 26, 2022. The disclosures of International Patent Application No. PCT/CN2022/132407 and Chinese Patent Application No. 202211037861.8 are incorporated herein by reference in their entireties.

TECHNICAL FIELD

The present disclosure relates to, but is not limited to, a voltage generating circuit and a memory.

BACKGROUND

A dynamic random access memory (DRAM) is widely used in modern electronic systems because of its characteristics such as high storage density and fast transmission speed. With development of a semiconductor technology, DRAM technology is more advanced, and the integration of memory cells is getting increasingly higher. In addition, various applications impose higher requirements on performance, power consumption, reliability and the like of the DRAM.

With the increasingly higher integration of the memory cells, more components need to be connected to control circuits corresponding to the memory cells to realize one-by-one control of the memory cells. However, as the memory cells are turned on, voltage fluctuations occur in the control circuits. As a result, voltages provided to the memory cells are not accurate enough, so it is necessary to provide a voltage generating circuit to improve the accuracy of the voltage generating circuit.

SUMMARY

An overview of the subject described in detail in the present disclosure is provided below, which is not intended to limit the protection scope of the claims.

Embodiments of the present disclosure provide a voltage generating circuit and a memory, which can at least improve the accuracy of the voltage generating circuit.

According to some embodiments of the present disclosure, the embodiments of the present disclosure provide a voltage generating circuit on one hand. The voltage generating circuit includes: a voltage output module configured to receive a reference voltage, generate a first output voltage, and provide the first output voltage to a power supply node, where the power supply node is connected to a load and supplies power to the load; a voltage stabilizing module configured to receive the reference voltage and generate a control signal and output the control signal; and a compensation module configured to receive a power voltage, a flag signal and the control signal, to be turned on in response to the flag signal, and to provide a second output voltage to the power supply node in response to a voltage value of the control signal, such that a voltage of the power supply node is recovered to the first output voltage, where the flag signal represents that the load is in an working state.

According to some embodiments of the present disclosure, the embodiments of the present disclosure further provide a memory on the other hand. The memory includes: the voltage generating circuit; and one or more loads connected to the power supply node and configured to work in response to one or more enable signals.

Other aspects of the present disclosure are understandable upon reading and understanding of the accompanying drawings and detailed description.

BRIEF DESCRIPTION OF THE DRAWINGS

One or more embodiments are exemplified by corresponding accompanying drawings, and these exemplified descriptions do not constitute a limitation on the embodiments. The accompanying drawings are not limited by scale unless otherwise specified. To describe the technical solutions in the embodiments of the present disclosure or in the prior art more clearly, the following outlines the accompanying drawings to be used in the embodiments of the present disclosure. Apparently, the accompanying drawings outlined below are merely some embodiments of the present disclosure. Those of ordinary skill in the art may derive other drawings from the outlined accompanying drawings without making any creative effort.

REFERENCE NUMERALS

100: Band-gap reference voltage generating module; 110: Reference voltage generating module; 120: Voltage stabilizing circuit module; 130: Load module; 140: Operational amplifier; 150: Fifth resistor; 160: PMOS transistor;

200: Voltage output module; 201: Second operational amplifier; 202: Third resistor; 203: Third PMOS transistor; 204: Fourth resistor; 210: Voltage stabilizing module; 211: First operational amplifier; 212: First resistor; 213: Second PMOS transistor; 214: Second NMOS transistor; 220: Compensation module; 221: Switching unit; 222: Adjusting unit; 223: First PMOS transistor; 224: First NMOS transistor; 230: First voltage generating module; 240: Flag signal generating module; 250: Second voltage generating module; 251: First voltage generating unit; 252: Second voltage generating unit; 260: Capacitor; 270: Resistor; and 280: Load.

DETAILED DESCRIPTION

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
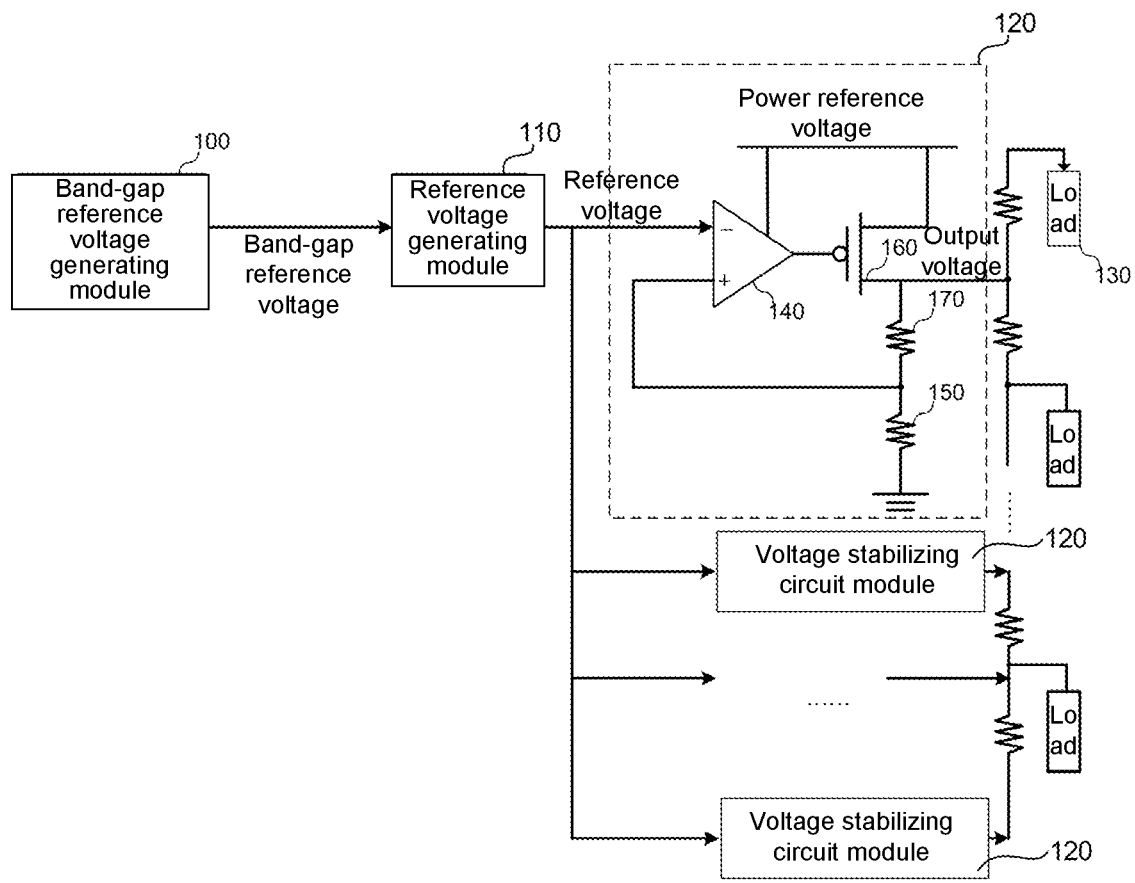
FIG. 1 is a schematic structural diagram of a voltage generating circuit according to an embodiment of the present disclosure.
Figure 2:
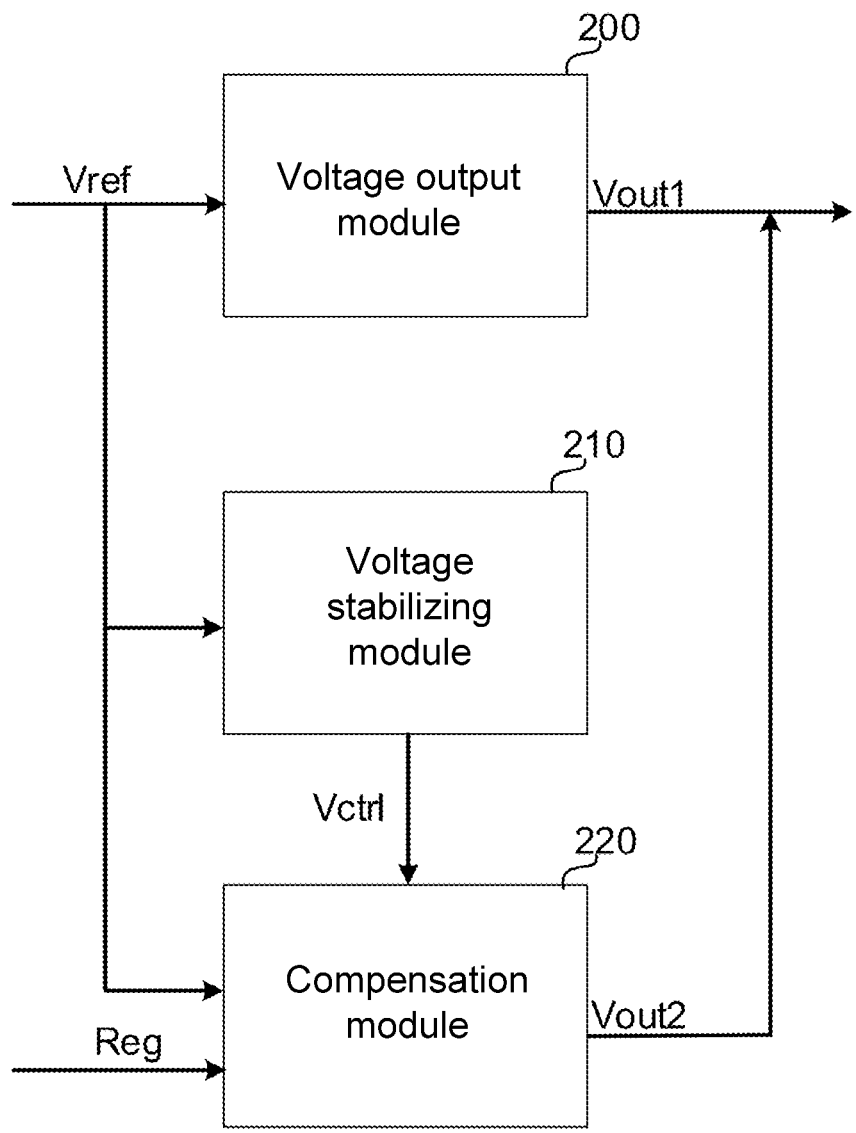
FIG. 2 is a schematic structural diagram of a voltage generating circuit according to another embodiment of the present disclosure.

In view of the background art, referring to FIG. 1, the circuit provided in FIG. 1 is a voltage generating circuit provided in the prior art. The voltage generating circuit provided in the prior art includes: a band-gap reference voltage generating module 100 and a reference voltage generating module 110 configured to provide a reference voltage; a plurality of voltage stabilizing circuit modules 120; and load modules 130 connected in one-to-one correspondence with the voltage stabilizing circuit modules 120. Each of the plurality of voltage stabilizing circuit modules 120 includes: an operational amplifier 140 having an inverting input terminal configured to receive the reference voltage; a fifth resistor 150 having one terminal grounded and the other terminal connected to a non-inverting input terminal of the operational amplifier 140; a PMOS transistor 160 having a gate connected to an output terminal of the operational amplifier 140 and a source connected to a working power supply; and a sixth resistor 170 having one terminal connected to the non-inverting input terminal of the operational amplifier 140 and the other terminal connected to a drain of the PMOS transistor 160. The voltage stabilizing circuit modules 120 can provide an output voltage to the load modules 130, to control turn-on of the load modules 130.

In general, the band-gap reference voltage generating module 100 generates a band-gap reference voltage and outputs the band-gap reference voltage to the reference voltage generating module 110, the reference voltage generating module 110 receives the band-gap reference voltage and generates and outputs the reference voltage, and the voltage stabilizing circuit modules 120 receive the reference voltage and output a target output voltage to the load modules 130.

However, when the load module 130 are turned on, the load module 130 consumes a part of the output voltage, such that the output voltage provided by connection node of the load module 130 and the voltage stabilizing circuit module 120 decreases, a voltage provided to the load modules 130 is lower than a preset value, and some components of the load module 130 may not work normally.

The embodiments of the present disclosure provide a voltage generating circuit and a memory. The voltage output module receives the reference voltage and provides a first output voltage to a power supply node, and the power supply node supplies power to a load. The voltage stabilizing module outputs a control signal to the compensation module. The compensation module receives a power voltage, a flag signal and the control signal, and provides a second output voltage to the power supply node, such that a voltage supplied by the power supply node is recovered to the first output voltage. In this way, when the load works, the voltage provided by the power supply node to the load can be stabilized at the first output voltage, such that the accuracy of the voltage generating circuit can be improved.

The embodiments of the present disclosure are described in detail below with reference to the accompanying drawings. However, those of ordinary skill in the art can understand that many technical details are proposed in the embodiments of the present disclosure to help readers better understand the present disclosure. However, even without these technical details and various changes and modifications made based on the following embodiments, the technical solutions claimed in the present disclosure may still be realized.

Figure 3:
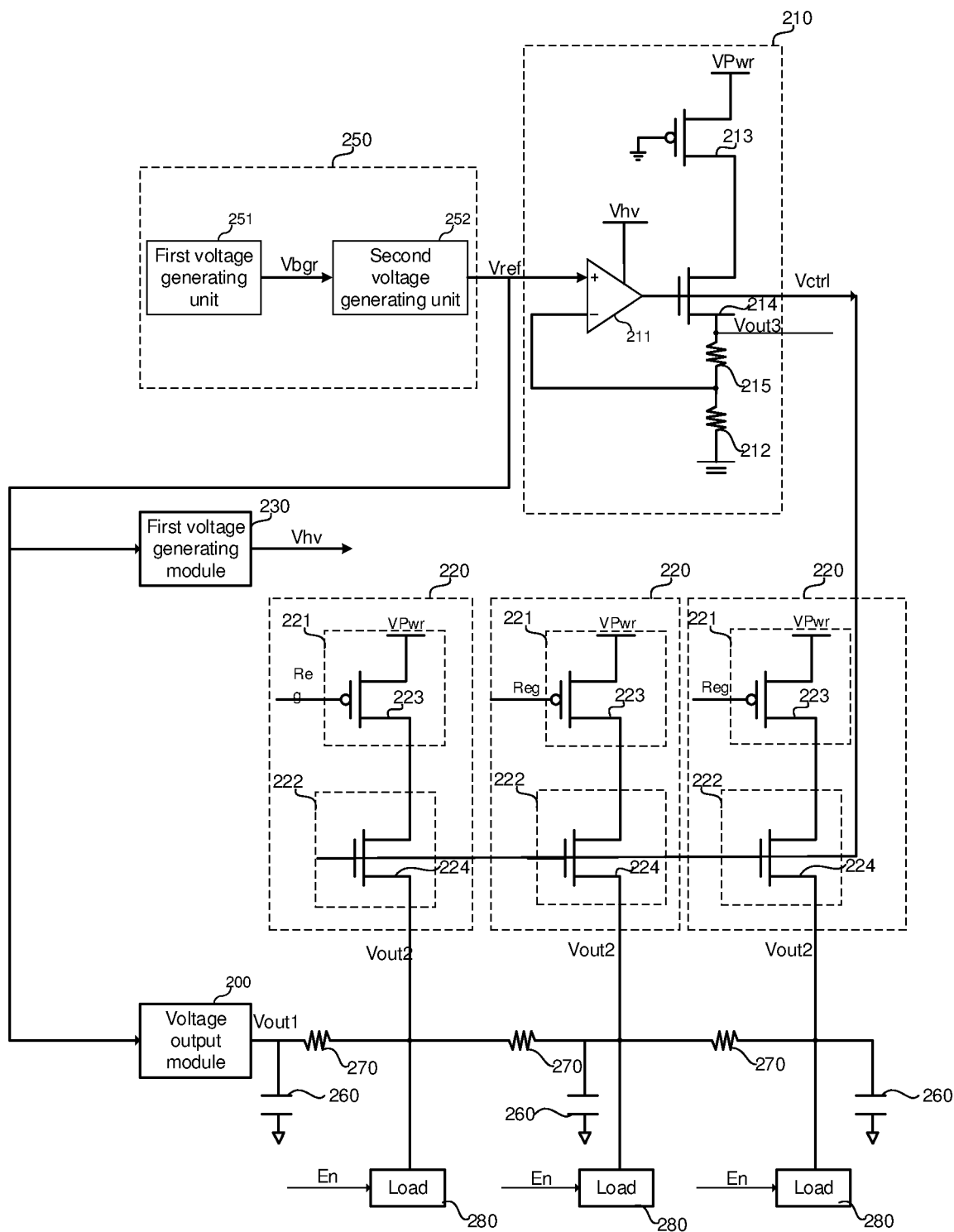
FIG. 3 is a specific schematic structural diagram of a voltage generating circuit according to another embodiment of the present disclosure.
Figure 4:
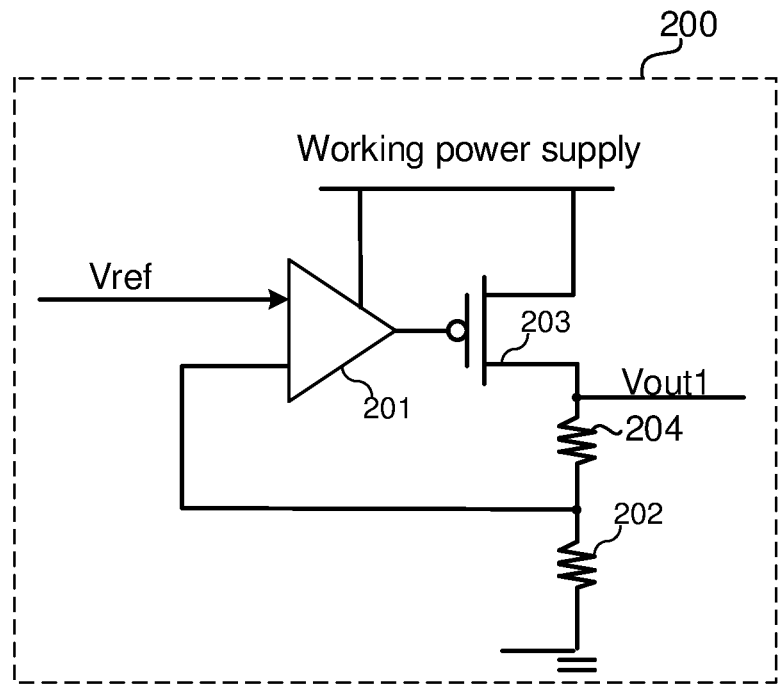
FIG. 4 is a specific schematic structural diagram of a voltage output module according to another embodiment of the present disclosure.
Figure 5:
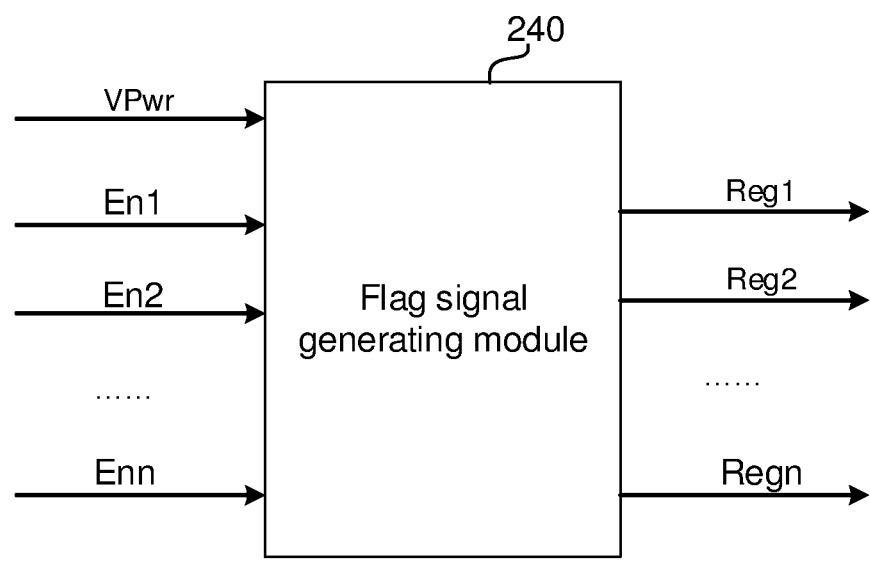
FIG. 5 is a schematic structural diagram of a flag signal generating module according to another embodiment of the present disclosure.
Figure 6:
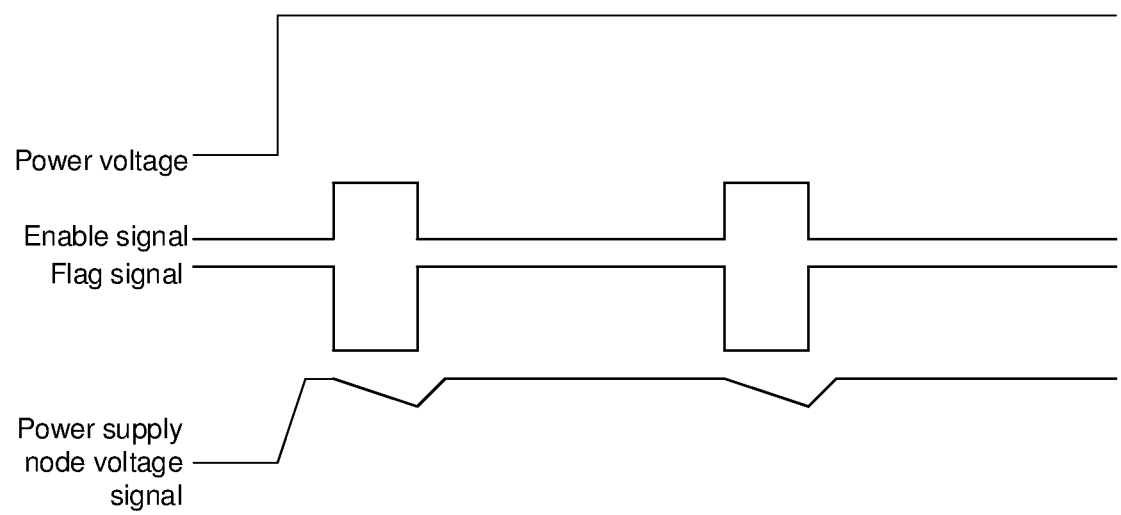
FIG. 6 is a signal fluctuation diagram according to another embodiment of the present disclosure.

Referring to FIG. 2 to FIG. 6, FIG. 2 is a schematic diagram of a circuit structure according to an embodiment of the present disclosure, FIG. 3 is a specific schematic structural diagram of a voltage stabilizing module, a compensation module and a second voltage generating module according to an embodiment of the present disclosure, FIG. 4 is a specific schematic structural diagram of a voltage output module according to an embodiment of the present disclosure, FIG. 5 is a schematic structural diagram of a flag signal generating module according to an embodiment of the present disclosure, and FIG. 6 is a signal fluctuation diagram according to an embodiment of the present disclosure. The voltage generating circuit includes:

a voltage output module 200, configured to receive a reference voltage Vref, generate a first output voltage Vout1, and provide the first output voltage Vout1 to a power supply node, where the power supply node is connected to a load to supply power to the load;

a voltage stabilizing module 210, configured to receive the reference voltage Vref and generate and output a control signal Vctrl; and a compensation module 220, configured to receive a power voltage VPwr, a flag signal Reg and the control signal Vctrl, and turn on in response to the flag signal Reg, and also configured to provide a second output voltage Vout2 to the power supply node in response to a voltage value of the control signal Vctrl, such that a voltage of the power supply node is recovered to the first output voltage Vout1, where the flag signal Reg represents that the load is working.

Specifically, when in the working period, the load receives the first output voltage Vout1 from the voltage output module 200 and is turned on. Because the load is turned on, the first output voltage Vout1 of the power supply node is consumed, and the voltage value of the first output voltage Vout1 of the power supply node is reduced. Meanwhile, the voltage stabilizing module 210 works, receives the reference voltage Vref, and provides the control signal Vctrl to the compensation module 220. The compensation module 220 receives the power voltage VPwr, the flag signal Reg and the control signal Vctrl, is turned on in response to the flag signal Reg, and generates and outputs the second output voltage Vout2 based on the voltage value of the control signal Vctrl. The power supply node receives the second output voltage Vout2 from the compensation module to compensate for the first output voltage Vout1 consumed by the load, such that the voltage provided by the power supply node to the load is stabilized at the first output voltage Vout1, and a voltage signal received by the load will not fluctuate due to the turn-on of the load. Moreover, the voltage provided by the voltage generating circuit to the load can be stabilized at the first output voltage Vout1, such that the accuracy of the voltage generating circuit can be improved.

It should be noted that the compensation module 220 in the above embodiment is turned on in response to the flag signal, and the flag signal Reg can be generated based on an enable signal En. In some other embodiments, the compensation module 220 can also be set to be directly turned on based on the enable signal En.

In some embodiments, the compensation module 220 may include: a switching unit 221 configured to receive the flag signal Reg and output the power voltage VPwr based on the flag signal Reg; and an adjusting unit 222 connected to the switching unit 221 and configured to receive the power voltage VPwr and the control signal Vctrl, to adjust an output amplitude of the compensation module 220 based on the voltage value of the control signal Vctrl. The switching unit 221 can control whether the compensation module 220 works. That is to say, only when the load is working, the switching unit 221 receives the flag signal Reg and outputs the power voltage VPwr to the adjusting unit 222, and the adjusting unit 222 can always be in a state of being turned on, and is turned on when receiving the power voltage VPwr provided by the adjusting unit 222, and adjusts the output amplitude of the compensation module 220 based on the voltage value of the control signal Vctrl, such that the second output voltage Vout2 can be provided to the power supply node, and the voltage value of the power supply node is recovered to the first output voltage Vout1, then the accuracy of the voltage value provided by the voltage generating circuit can be improved.

In some embodiments, the switching unit 221 may include a first PMOS transistor 223 having a gate configured to receive the flag signal Reg and a source connected to a working power supply; and the adjusting unit 222 includes a first NMOS transistor 224 having a gate configured to receive the control signal Vctrl, a drain connected to a drain of the first PMOS transistor 223, and a source connected to the power supply node, to provide the second output voltage Vout2.

It can be understood that the working power supply can be configured to provide the power voltage VPwr. The flag signal Reg may include two states: one is a high-level state, and the other one is a low-level state. When the flag signal Reg received by the gate of the first PMOS transistor 223 is in the low-level state, the first PMOS transistor 223 is turned on and provides the power voltage VPwr to the drain of the first NMOS transistor 224. When the drain of the first NMOS transistor 224 receives the power voltage VPwr, the gate receives the control signal Vctrl, and the first NMOS transistor 224 is turned on and provides the second output voltage Vout2 to the power supply node through the source, to recover the voltage value of the power supply node to the first output voltage Vout1, such that the accuracy of the voltage value provided by the voltage generating circuit can be improved.

In some embodiments, the voltage generating circuit may include a plurality of compensation modules 220 and a plurality of power supply nodes, and each of the compensation modules 220 is correspondingly connected to one power supply node. The plurality of power supply nodes provide the second output voltage Vout2 to different loads 280, such that each load 280 has a corresponding compensation module 220. Moreover, the plurality of compensation modules 220 can be connected in parallel to reduce the layout area of the voltage generating circuit, and the voltage generating circuit has a faster response speed.

In some embodiments, the voltage stabilizing module 210 may include: a first operational amplifier 211 having a non-inverting input terminal configured to receive the reference voltage Vref and an output terminal configured to output the control signal Vctrl; a first resistor 212 having one terminal grounded and the other terminal connected to an inverting input terminal of the first operational amplifier 211; a second PMOS transistor 213 having a source connected to the power voltage VPwr; a second NMOS transistor 214 having a gate connected to an output terminal of the first operational amplifier 211 and a drain connected to a drain of the second PMOS transistor 213; and a second resistor 215 having one terminal connected to the inverting input terminal of the first operational amplifier 211 and the other terminal connected to a source of the second NMOS transistor 214.

Specifically, the voltage stabilizing principle of the voltage stabilizing module 210 is as follows: when the output voltage is reduced, the voltage provided to the inverting input terminal of the first operational amplifier 211 is reduced by voltage dividing effect of the first resistor 212 and the second resistor 215. However, the voltage value of the reference voltage Vref connected to the non-inverting input terminal of the first operational amplifier 211 is stable. Therefore, the output voltage outputted from the output terminal of the first operational amplifier 211 is correspondingly increased, the gate voltage of the second NMOS transistor 214 is increased, and the output voltage of the voltage stabilizing module 210 is correspondingly increased, thereby inhibiting the reduction of the output voltage, and keeping a stable output voltage.

In the embodiments of the present disclosure, the second PMOS transistor 213 has a source connected to the power voltage VPwr and a gate grounded. Therefore, the second PMOS transistor 213 is always turned on. The power voltage VPwr is provided from the drain of the second PMOS transistor 213 to the drain of the second NMOS transistor 214. The gate of the second NMOS transistor 214 is connected to the output terminal of the first operational amplifier 211. When the reference voltage Vref is provided to the first operational amplifier 211, the second NMOS transistor 214 is turned on, and the whole voltage stabilizing module 210 starts to work.

It can be understood that the output voltage of the voltage stabilizing module 210 may be a third output voltage Vout3. The voltage value of the third output voltage Vout3 may be Vref*(R1+R2)/R1, where Vref represents the voltage value of the reference voltage Vref, R1 represents the resistance of the first resistor 212, R2 represents the resistance of the second resistor 215, * represents the multiplication operation in mathematics, and/represents the division operation in mathematics.

The control signal Vctrl provided by the voltage stabilizing module 210 is connected to the gate of the second NMOS transistor 214. Therefore, the voltage value of the control signal Vctrl is Vout3+Vth, where Vout3 represents the voltage value of the third output voltage that can be provided by the voltage stabilizing module 210, and Vth represents the threshold voltage of the second NMOS transistor 214.

In some embodiments, a width-to-length ratio of a channel in the first NMOS transistor 224 is equal to a width-to-length ratio of a channel in the second NMOS transistor 214. It can be understood that the width-to-length ratio of the channel in the first NMOS transistor 224 is equal to the width-to-length ratio of the channel in the second NMOS transistor 214, that is to say, the threshold voltage of the first NMOS transistor 224 is equal to the threshold voltage of the second NMOS transistor 214. That is to say, when the gate of the first NMOS transistor 224 receives the control signal Vctrl provided by the voltage stabilizing module 210, the voltage outputted from the source of the first NMOS transistor 224 is Vctrl minus the threshold voltage of the first NMOS transistor 224, i.e., being equal to the voltage value of the third output voltage Vout3. That is to say, the voltage value of the second output voltage Vout2 is equal to the voltage value of the third output voltage Vout3. However, the voltage value of the third output voltage Vout3 is equal to the voltage value of the first output voltage Vout1. That is to say, by controlling the width-to-length ratio of the channel in the first NMOS transistor 224 to be equal to the width-to-length ratio of the channel in the second NMOS transistor 214, the voltage value of the second output voltage Vout2 can be controlled to be equal to the voltage value of the first output voltage Vout1, such that the accuracy of the voltage generating circuit can be improved, and the voltage value provided by the voltage generating circuit to the power supply node is stabilized at the first output voltage Vout1.

It should be noted that the width-to-length ratio of the channel in the first NMOS transistor 224 is equal to the width-to-length ratio of the channel in the second NMOS transistor 214, which is ideal. Actually, there may be a certain deviation between the width-to-length ratio of the channel in the first NMOS transistor 224 and the width-to-length ratio of the channel in the second NMOS transistor 214. However, the deviation needs to be within a preset deviation range. That is to say, a voltage difference between the actual output voltage of the compensation module 220 and a ideal second output voltage Vout2 is within a preset range. In other words, the actual output voltage of the compensation module 220 may be slightly greater than or less than the ideal second output voltage Vout2. When the actual output voltage of the compensation module 220 is much greater than the ideal second output voltage Vout2, the compensation module 220 may generate large noise. When the actual output voltage of the compensation module 220 is much less than the ideal second output voltage Vout2, the capability of stabilizing the voltage of the power supply node at and recovering the voltage of the power supply node to the first output voltage Vout1 is weaker, and the improvement effect is not good.

In some embodiments, the voltage generating circuit further includes: a first voltage generating module 230 configured to receive the reference voltage Vref and generate a driving voltage Vhv for driving the first operational amplifier 211 to work. The voltage value of the driving voltage Vhv is greater than a sum of the voltage value of the control signal Vctrl and the threshold voltage of an NMOS transistor connected in series, inside the first operational amplifier 211, between a power supply terminal where the driving voltage is inputted and the output terminal of the first operational amplifier 211. The driving voltage is provided to the first operational amplifier 211 to serve as the power voltage, such that it can be ensured that the first operational amplifier 211 can output the needed control signal Vctrl. It can be understood that when a plurality of MOS transistors are connected in series between the output terminal of the first operational amplifier and the power supply terminal, the voltage value of the driving voltage Vhv should be greater than the sum of the voltage value corresponding to the control signal Vctrl and the threshold voltages corresponding to the plurality of MOS transistors. That is, the maximum value of the output voltage of the first operational amplifier 211 is greater than the voltage value corresponding to the control signal Vctrl.

In some embodiments, the voltage generating circuit may further include: a flag signal generating module 240 configured to generate the flag signal Reg based on an enable signal En, where the enable signal En is used to control the load 280 to work. In the embodiments of the present disclosure, the flag signal generating module 240 can convert the enable signal En into a corresponding flag signal Reg. For example, a first enable signal En1, a second enable signal En2, and a third enable signal En3 are provided to the flag signal generating module 240. The flag signal generating module 240 can generate corresponding first flag signal Reg1, second flag signal Reg2, and third flag signal Reg3. Moreover, different enable signals En can be provided to different loads, and the flag signals Reg corresponding to the enable signals En can be provided to the compensation modules 220 connected to the corresponding loads 280. In this way, when the load 280 corresponding to the first enable signal En1 is turned on, the compensation module 220 receiving the first flag signal Reg1 starts to work, to provide the second output voltage Vout2 to the load 280, such that the voltage of the power supply node corresponding to the load 280 can be compensated.

In some embodiments, referring to FIG. 4, the voltage output module 200 may include: a second operational amplifier 201 having an inverting input terminal configured to receive the reference voltage Vref; a third resistor 202 having one terminal grounded and the other terminal connected to a non-inverting input terminal of the second operational amplifier 201; a third PMOS transistor 203 having a gate connected to an output terminal of the second operational amplifier 201, a source connected to the working power supply, and a drain configured to output the first output voltage Vout1; and a fourth resistor 204 having one terminal connected to the non-inverting input terminal of the second operational amplifier 201 and the other terminal connected to the drain of the third PMOS transistor 203.

It can be understood that the working principle of the voltage output module 200 is as follows: when the output voltage of the voltage output module 200 is reduced, the voltage provided to the non-inverting input terminal of the second operational amplifier 201 is reduced by voltage dividing effect of the third resistor 202 and the fourth resistor 204. However, the voltage value of the reference voltage Vref connected to the inverting input terminal of the second operational amplifier 201 is stable. Therefore, the voltage of the output terminal of the second operational amplifier 201 is correspondingly reduced, the gate voltage of the third PMOS transistor 203 is reduced, and the output voltage of the voltage output module 200 is correspondingly increased, thereby inhibiting the reduction of the output voltage, and keeping the output voltage stable.

In some embodiments, a voltage value of the working power supply connected to the source of the third PMOS transistor 203 is equal to a voltage value of a driving voltage of the second operational amplifier 201. In other words, the source of the third PMOS transistor 203 and the second operational amplifier 201 can be connected to a same working power supply, thereby reducing the complexity caused by setting different power supplies.

In some embodiments, the specification of the first operational amplifier 211 may also be the same as that of the second operational amplifier 201, such that the difference between the third output voltage Vout3 and the first output voltage Vout1 can be reduced, the difference between the second output voltage Vout2 generated based on the control signal Vctrl and the first output voltage Vout1 can be reduced, and the voltage of the power supply node is recovered to the first output voltage Vout1.

In some embodiments, the voltage generating circuit may further include: a second voltage generating module 250 configured to provide the reference voltage Vref. The second voltage generating module 250 can provide the reference voltage Vref to the voltage output module 200, the voltage stabilizing module 210 and the first voltage generating module 230.

In some embodiments, the second voltage generating module 250 may include: a first voltage generating unit 251 and a second voltage generating unit 252. The first voltage generating unit 251 can generate a band-gap reference voltage Vbgr, and the second voltage generating unit 252 can receive the band-gap reference voltage Vbgr and generate the reference voltage Vref. In a memory, the band-gap reference voltage Vbgr is a stable voltage, and the voltage value is not affected by the temperature. Therefore, the band-gap reference voltage Vbgr provided by the first voltage generating unit 251 is not affected by the temperature, thereby generating a stable reference voltage Vref.

In some embodiments, the voltage generating circuit may further include: a capacitor 260 having one terminal connected to an output terminal of the voltage output module 200 and the other terminal grounded. Setting the capacitor 260 can achieve an effect of filtering, such that the reliability of the voltage provided by the voltage generating circuit can be increased.

In some embodiments, the voltage generating circuit may further include: a resistor 270 having one terminal connected to an output terminal of the voltage output module 200 and the other terminal connected to the power supply node. Setting the resistor 270 can improve the safety of the voltage generating circuit and reduce the interactions among different voltage nodes in a power network.

Referring to FIG. 3 and FIG. 6, FIG. 6 is a signal fluctuation diagram of a voltage generating circuit. Specifically, the power voltage VPwr having a high level is always provided, such that the voltage stabilizing module 210 and the flag signal generating module 240 start to work, and the enable signal En is provided to the load 280 and the flag signal generating module 240. When the enable signal En is at a high level, the load 280 is turned on, and the voltage of the power supply node connected to the load 280 fluctuates. And when the enable signal En is at a high level, the flag signal generating module 240 is synchronized to provide the flag signal Reg to the compensation module 220, such that the compensation module 220 works, and the second output voltage Vout2 is provided to the power supply node to compensate for the voltage of the power supply node. Reference may be made to the voltage fluctuation diagram of the power supply node. When the enable signal En is at a low level, the power supply node receives the first output voltage Vout1 from the voltage output module 200, the voltage rises, the enable signal En is changed to a high level, and the load 280 is turned on, such that the voltage of the power supply node is consumed and starts to drop. The compensation module 220 works to compensate for the voltage of the power supply node, to slow down the reduction of the voltage of the power supply node. When the enable signal En is changed to a low level again, the load is turned off, the flag signal Reg is lowered, the compensation module 220 is turned off, the power supply node receives the first output voltage Vout1 from the voltage output module 200, and the voltage rises.

Compared with the prior art corresponding to FIG. 1, the embodiments of the present disclosure have a smaller layout area, a smaller power supply tolerance range from the power voltage VPwr to the first output voltage Vout1, less power consumption, faster responsiveness, and higher accuracy.

According to the embodiments of the present disclosure, the voltage output module 200 provides the first output voltage Vout1 to the power supply node. When the load 280 works to cause the voltage of the power supply node to drop, the voltage stabilizing module 210 works and receives the reference voltage Vref and provide the control signal Vctrl to the compensation module 220. The compensation module 220 receives the power voltage VPwr, the flag signal Reg and the control signal Vctrl, is turned on in response to the flag signal Reg, generates the second output voltage Vout2 based on the voltage value of the control signal Vctrl, and outputs the second output voltage Vout2 to the power supply node, thereby compensating for the first output voltage Vout1 consumed by the load on the power supply node. In this way, the voltage provided by the voltage generating circuit to the load is stabilized at the first output voltage Vout1, and the accuracy of the voltage generating circuit can be improved.

It is worth mentioning that each unit involved in this embodiment is a logical unit. During practical application, a logical unit may be a physical unit, or may be a part of a physical unit, or may be implemented as a combination of a plurality of physical units. In addition, in order to highlight the innovative parts of the present disclosure, units that are not closely related to resolving the technical problem proposed by the present disclosure are not introduced in this embodiment, but this does not indicate that there are no other units in this embodiment.

It should be noted that, features disclosed in the power supply circuit provided in the foregoing embodiment can be arbitrarily combined without conflict, and a new power supply circuit embodiment can be obtained.

Another embodiment of the present disclosure further provides a memory, which may include the above voltage generating circuit. The memory provided in the embodiment of the present disclosure is described in detail below with reference to the accompanying drawings. It should be noted that, for the parts the same as or corresponding to those mentioned in the foregoing embodiment, reference may be made to the foregoing embodiment, and details will not be described herein again.

Referring to FIG. 2 to FIG. 6, the memory provided in the embodiment of the present disclosure includes: the voltage generating circuit mentioned above; and a load 280 connected to a power supply node and working in response to an enable signal En.

According to the embodiments of the present disclosure, the voltage output module 200 provides the first output voltage Vout1 to the power supply node. When the load 280 works to cause the voltage of the power supply node to drop, the voltage stabilizing module 210 works and receives the reference voltage Vref to provide the control signal Vctrl to the compensation module 220. The compensation module 220 receives the power voltage VPwr, the flag signal Reg and the control signal Vctrl, is turned on in response to the flag signal Reg, generates the second output voltage Vout2 based on the voltage value of the control signal Vctrl, and outputs the second output voltage Vout2 to the power supply node, thereby compensating for the first output voltage Vout1 consumed by the load 280 on the power supply node. In this way, the voltage provided by the voltage generating circuit to the load 280 is stabilized at the first output voltage Vout1, and the accuracy of the voltage generating circuit can be improved.

In some embodiments, there may be a plurality of loads 280, and different loads 280 work in response to different enable signals En. The voltage generating circuit has a plurality of power supply nodes, and each power supply node is connected to one load 280. The voltage generating circuit includes a plurality of compensation modules 220, and each compensation module 220 provides the second output voltage Vout2 to the corresponding power supply node in response to the corresponding flag signal Reg.

Taking an example where there are three loads 280, the three loads 280 may be a first load, a second load and a third load, which are connected to different power supply nodes. Each power supply node is correspondingly connected to a different compensation module 220. Different compensation modules 220 provide the second output voltage Vout2 to the different loads respectively, such that each load 280 is compensated by the corresponding compensation module 220.

In some embodiments, the plurality of loads 280 can be turned on at the same time, and correspondingly, the plurality of compensation modules 220 are also turned on at the same time. In some other embodiments, one of the plurality of loads 280 can be turned on, and correspondingly, the compensation module 220 connected to the turned-on load is turned on correspondingly.

In general, the working principle of the memory is as follows: when the load 280 is in a working state, the load 280 consumes part of the first output voltage Vout1 provided to the power supply node by the voltage output module 200, such that the voltage of the power supply node is reduced. When the load 280 is in the working state, the compensation module 220 receives the flag signal Reg, generates the second output voltage Vout2 based on the control signal Vctrl, and provides the second output voltage Vout2 to the power supply node to compensate for the first output voltage Vout1 consumed by the load 280, such that the voltage of the power supply node is recovered, thereby ensuring the stability and the accuracy of the voltage provided to the power supply node by the voltage generating circuit.

Referring to the signal fluctuation diagram shown in FIG. 6, when the load 280 is provided the enable signal En, that is, the enable signal En in FIG. 6 is at a high level, the load 280 starts to work. At the moment when the load 280 works, since the work of the load 280 consumes part of the voltage of the power supply node, the voltage of the power supply node is reduced. While the enable signal En is provided to the load 280, the enable signal En is synchronously provided to the flag signal generating module 240. The flag signal generating module 240 generates the flag signal Reg, and provides the flag signal Reg to the compensation module 220. The compensation module 220 receives the flag signal Reg to start to work, such that the compensation module 220 outputs the second output voltage Vout2 to compensate for the power supply node. In this way, the reduction of the voltage of the power supply node can be reduced, and the accuracy of the voltage generating circuit can be improved. When the load 280 stops working, that is, the enable signal En is changed from a high level to a low level, the voltage of the power supply node is no longer consumed, the compensation module 220 no longer receives the flag signal Reg, the compensation module stops working, and the power supply node receives the first output voltage Vout1 provided by the voltage output module 200 and the voltage of the power supply node rises.

In some embodiments, the signal fluctuation diagram shown in FIG. 6 may show the enable signal En received by a certain load 280 within a certain time and the flag signal Reg received by the compensation module 220 correspondingly connected to the load 280. That is to say, the load 280 is turned on once at a certain interval in a certain period of time. In some other embodiments, the signal fluctuation diagram shown in FIG. 6 may also be a whole signal fluctuation diagram of the memory. That is to say, one of the loads 280 in the memory is turned on. The loads 280 in the memory sequentially receive the enable signal En, and are turned on in response to the enable signal En. When one of the loads 280 in the memory is turned on, the rest of the loads 280 are all tuned off.

It should be noted that the memory may be a memory cell or device based on a semiconductor device or component. For example, the memory device may be a volatile memory, for example, a dynamic random-access memory (DRAM), a synchronous dynamic random-access memory (SDRAM), a double data rate synchronous dynamic random-access memory (DDR SDRAM), a low-power double data rate synchronous dynamic random-access memory (LPDDR SDRAM), a graphics double data rate synchronous dynamic random-access memory (GDDR SDRAM), a double data rate type 2 synchronous dynamic random-access memory (DDR2 SDRAM), a double data rate 3 synchronous dynamic random-access memory (DDR3 SDRAM), a double data rate 4 synchronous dynamic random-access memory (DDR4 SDRAM), or a thyristor random-access memory (TRAM); or may be a non-volatile memory, for example, a phase-change random-access memory (PRAM), a magnetoresistive random-access memory (MRAM), or a resistive random-access memory (RRAM).

According to the embodiments of the present disclosure, the voltage generating circuit provided in the above embodiment supplies power to provide a more stable first output voltage Vout1 to the load 280, such that the first output voltage Vout1 is more accurate, and the response speed and the accuracy of the memory can be improved.

Those skilled in the art can understand that the above implementations are specific embodiments for implementing the present disclosure. In practical applications, various changes may be made to the above embodiments in terms of form and details without departing from the spirit and scope of the embodiments of the present disclosure. Any person skilled in the art may make changes and modifications to the embodiments without departing from the spirit and scope of the present disclosure. Therefore, the protection scope of the present disclosure should be subject to the scope defined by the claims.

INDUSTRIAL APPLICABILITY

In the voltage generating circuit and the memory provided in the embodiments of the present disclosure, the voltage output module provides the first output voltage to the power supply node, to supply power to the load; the voltage stabilizing module can output the control signal; and the compensation module receives the power voltage, the flag signal and the control signal, is turned on in response to the flag signal, and provides the second output voltage to the power supply node in response to the voltage value of the control signal, such that the voltage of the power supply node is recovered to the first output voltage, and the accuracy of the voltage generating circuit can be improved.

The invention claimed is:
1. A voltage generating circuit, comprising:
  a voltage output module, configured to receive a reference voltage, generate a first output voltage and provide the first output voltage to a power supply node, wherein the power supply node is connected to a load and supplies power to the load;
  a voltage stabilizing module, configured to receive the reference voltage and generate a control signal and output the control signal; and
  a compensation module, configured to receive a power voltage, a flag signal and the control signal, to be turned on in response to the flag signal, and to provide a second output voltage to the power supply node in response to a voltage value of the control signal, such that a voltage of the power supply node is recovered to the first output voltage, wherein the flag signal represents that the load is in an working state.

2. The voltage generating circuit according to claim 1, wherein the compensation module comprises:
   a switching unit, configured to receive the flag signal and output the power voltage based on the flag signal; and
   an adjusting unit, connected to the switching unit and configured to receive the power voltage and the control signal, to adjust an output amplitude of the compensation module based on the voltage value of the control signal.

3. The voltage generating circuit according to claim 2, wherein the switching unit comprises a first p-channel metal oxide semiconductor (PMOS) transistor having a gate configured to receive the flag signal and a source connected to a working power supply; and
   the adjusting unit comprises a first n-channel metal oxide semiconductor (NMOS) transistor having a gate configured to receive the control signal, a drain connected to a drain of the first PMOS transistor, and a source connected to the power supply node to provide the second output voltage.

4. The voltage generating circuit according to claim 3, wherein the voltage stabilizing module comprises:
   a first operational amplifier having a non-inverting input terminal configured to receive the reference voltage and an output terminal configured to output the control signal;
   a first resistor having one terminal grounded and a second terminal connected to an inverting input terminal of the first operational amplifier;
   a second PMOS transistor having a source connected to the power voltage;
   a second NMOS transistor having a gate connected to an output terminal of the first operational amplifier and a drain connected to a drain of the second PMOS transistor; and
   a second resistor having one terminal connected to the inverting input terminal of the first operational amplifier and a second terminal connected to a source of the second NMOS transistor.

5. The voltage generating circuit according to claim 4, wherein a width-to-length ratio of a channel in the first NMOS transistor is equal to a width-to-length ratio of a channel in the second NMOS transistor.

6. The voltage generating circuit according to claim 4, further comprising:
   a first voltage generating module, configured to receive the reference voltage and generate a driving voltage for driving the first operational amplifier to work.

7. The voltage generating circuit according to claim 6, wherein a voltage value of the driving voltage is greater than a sum of the voltage value of the control signal and a voltage value of a turn-on voltage of the second NMOS transistor.

8. The voltage generating circuit according to claim 1, further comprising:
   a flag signal generating module, configured to generate the flag signal based on an enable signal, wherein the enable signal is used to control the load to work.

9. The voltage generating circuit according to claim 1, wherein the voltage output module comprises:
   a second operational amplifier having an inverting input terminal configured to receive the reference voltage;
   a third resistor having one terminal grounded and a second terminal connected to a non-inverting input terminal of the second operational amplifier;
   a third p-channel metal oxide semiconductor (PMOS) transistor having a gate connected to an output terminal of the second operational amplifier, a source connected to a working power supply, and a drain configured to output the first output voltage; and
   a fourth resistor having one terminal connected to the non-inverting input terminal of the second operational amplifier and a second terminal connected to the drain of the third PMOS transistor.

10. The voltage generating circuit according to claim 9, wherein a voltage value of the working power supply connected to the source of the third PMOS transistor is equal to a voltage value of a driving voltage of the second operational amplifier.

11. The voltage generating circuit according to claim 1, further comprising:
    a second voltage generating module, configured to provide the reference voltage.

12. The voltage generating circuit according to claim 1, further comprising:
    a capacitor having one terminal connected to an output terminal of the voltage output module and a second terminal grounded.

13. A memory, comprising:
    a voltage generating circuit according to claim 1; and
    one or more loads connected to the power supply node and configured to work in response to one or more enable signals.

14. The memory according to claim 13, wherein the memory comprises a plurality of loads, and different loads work in response to different enable signals;
    the voltage generating circuit has a plurality of power supply nodes, and each of the plurality of power supply nodes is connected to one of the plurality of loads; and
    the voltage generating circuit comprises a plurality of compensation modules, and each of the plurality of compensation modules provides a second output voltage to corresponding power supply node of the plurality of power supply nodes in response to a corresponding flag signal.

* * * * *